United States Patent
Sato et al.

(10) Patent No.: US 6,833,598 B2
(45) Date of Patent: Dec. 21, 2004

(54) SPIN VALVE TRANSISTOR

(75) Inventors: Rie Sato, Yokohama (JP); Koichi Mizushima, Kamakura (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/320,648

(22) Filed: Dec. 17, 2002

(65) Prior Publication Data

US 2003/0122208 A1 Jul. 3, 2003

Related U.S. Application Data

(63) Continuation of application No. PCT/JP02/03395, filed on Apr. 4, 2002.

(30) Foreign Application Priority Data

Apr. 6, 2001 (JP) ......................................... 2001-108620

(51) Int. Cl.[7] .............................................. H01L 29/82
(52) U.S. Cl. .................................. 257/421; 360/324.12
(58) Field of Search ......................................... 257/421

(56) References Cited

U.S. PATENT DOCUMENTS

| | | |
|---|---|---|
| 5,747,859 A | 5/1998 | Mizushima et al. |
| 5,973,334 A | 10/1999 | Mizushima et al. |
| 6,480,365 B1 * | 11/2002 | Gill et al. ............... 360/324.11 |

FOREIGN PATENT DOCUMENTS

GB 2 333 900 * 8/1999

OTHER PUBLICATIONS

K. Mizushima, T. Kinno, K. Tanaka, and T. Yamauchi, "Strong Increase of the effective polarization of the tunnel current in Fe/AlO$_x$/Al junctions with decreasing Fe layer thickness", Physical Reveiw B, vol. 58, No. 8, Aug. 15, 1998–II, pp. 4660–4665.

K. Mizushima, T. Kinno, T. Yamauchi and K. Tanaka, "Energy–Dependent Hot Electron Transport across a Spin-Valve", IEEE Transactions on Magnetics, vol. 33, No. 5, Sep. 1997, pp. 3500–3504.

* cited by examiner

Primary Examiner—Douglas Wille
(74) Attorney, Agent, or Firm—Oblon, Spivak, McClelland, Maier & Neustadt, P.C.

(57) ABSTRACT

There is provided a spin valve transistor that comprises a collector region made of semiconductor, a base region provided on the collector region and including a first ferromagnetic layer whose magnetization direction changes in accordance with a direction of an external magnetic field, a barrier layer provided on the base layer and made of insulator or semiconductor, and an emitter region provided on the barrier layer and including a second ferromagnetic layer whose magnetization direction is fixed.

18 Claims, 2 Drawing Sheets

SPIN VALVE TRANSISTOR

CROSS-REFERENCE TO RELATED APPLICATIONS

This is a Continuation Application of PCT Application No. PCT/JP02/03395, filed Apr. 4, 2002, which was not published under PCT Article 21(2) in English.

This application is based upon and claims the benefit of priority from the prior Japanese Patent Application No. 2001-108620, filed Apr. 6, 2001, the entire contents of which are incorporated herein by reference.

BACKGROUND OF THE INVENTION

1. Field of the Invention

The present invention relates to a spin valve transistor for use in reading magnetic heads and the like for magnetic recording.

2. Description of the Related Art

In recent years, spin valve transistors (spin tunnel transistors) that have a large magneto-current ratio (MR ratio) have come to attract attention as magnetic sensors for reading data from magnetic discs.

FIG. 4 is a cross-sectional view, or a schematic representation of the structure of a conventional spin valve transistor.

The spin valve transistor depicted in FIG. 4 comprises a collector region 1 (semiconductor layer 11), a base region 2 (ferromagnetic layer 12, nonmagnetic layer 13 and ferromagnetic layer 15), a barrier layer 3 (insulating layer 14 for a tunnel (or a semiconductor layer for a Schottky barrier)), and an emitter region 4 (electrode layer 17). As FIG. 4 shows, a metal layer 19 is provided on the ferromagnetic layer 12. The metal layer 19 may be dispensed with, nonetheless.

Of the two ferromagnetic layers 12 and 15 provided in the base region 2, the lower ferromagnetic layer 15 is fixed in magnetization direction. On the other hand, the upper ferromagnetic layer 12 is not fixed in magnetization direction; its magnetization direction changes in accordance with the direction of an external magnetic field emanating from a magnetic disc or the like. The electron current flowing from the emitter region 4 to the collector region 1 through the base region 2 is larger when the upper ferromagnetic layer 12 has the same magnetization direction as the lower ferromagnetic layer 15 than when the layer 12 has the opposite magnetization direction. Hence, the magnetization direction of the magnetic disc or the like can be determined by detecting the magnitude of this current.

The spin valve transistor can acquire an extremely large MR ratio of several hundred percent. However, it is disadvantageous in that the collector current is very small, about $10^{-4}$ of the emitter current. The small ratio of the collector current to the emitter current is not desirable in view of power consumption, operating speed and noise.

The ratio of the collector current to the emitter current (i.e., current gain) is small, because the hot electrons injected into the base region undergo diffuse scattering in the ferromagnetic layer or at the interface between the ferromagnetic layer and the nonmagnetic layer. Once subjected to diffuse scattering, hot electrons cannot move into the collector region and move from the base region to the outside of the element. Therefore, the diffuse scattering in the ferromagnetic layer or at the interface between the ferromagnetic layer and the nonmagnetic layer should be suppressed in order to increase the collector current.

The diffuse scattering in the ferromagnetic layer can be suppressed by reducing the thickness of the ferromagnetic layer. In the spin valve transistor, however, many interfaces exist since the base layer has two ferromagnetic layers 12 and 15. It is therefore difficult to suppress the diffuse scattering at the interface. The probability of the diffuse scattering exponentially increases with the number of interfaces. Thus, the diffuse scattering at the interface makes a great problem with the spin valve transistor.

Most spin valve transistors must have an antiferromagnetic layer in order to fix the magnetization direction of the ferromagnetic layer. In the conventional spin valve transistor described above, the diffuse scattering in the base region will increase even more if an antiferromagnetic layer is provided on the ferromagnetic layer 15. The collector current will inevitably decrease very much. Conversely, the antiferromagnetic layer may be provided beneath the ferromagnetic layer. In this case, the antiferromagnetic layer must not cover the region through which electrons move into the collector region. Consequently, the magnetization direction of the ferromagnetic layer cannot be firmly fixed, and the transistor cannot exhibit a stable output characteristic.

As specified above, the conventional spin valve transistor cannot have a large current gain or a stable operating characteristic, because any ferromagnetic layer is provided in the base region. It is therefore desired that a spin valve transistor that has a large current gain and a stable operating characteristic.

BRIEF SUMMARY OF THE INVENTION

According to an aspect of the invention, there is provided a spin valve transistor that comprises a collector region made of semiconductor; a base region provided on the collector region and including a first ferromagnetic layer whose magnetization direction changes in-accordance with a direction of an external magnetic field; a barrier layer provided on the base layer and made of insulator or semiconductor; and an emitter region provided on the barrier layer and including a second ferromagnetic layer whose magnetization direction is fixed.

DETAILED DESCRIPTION OF THE INVENTION

Embodiments of the present invention will be described, with reference to the accompanying drawings.

(First Embodiment)

Figure 1:
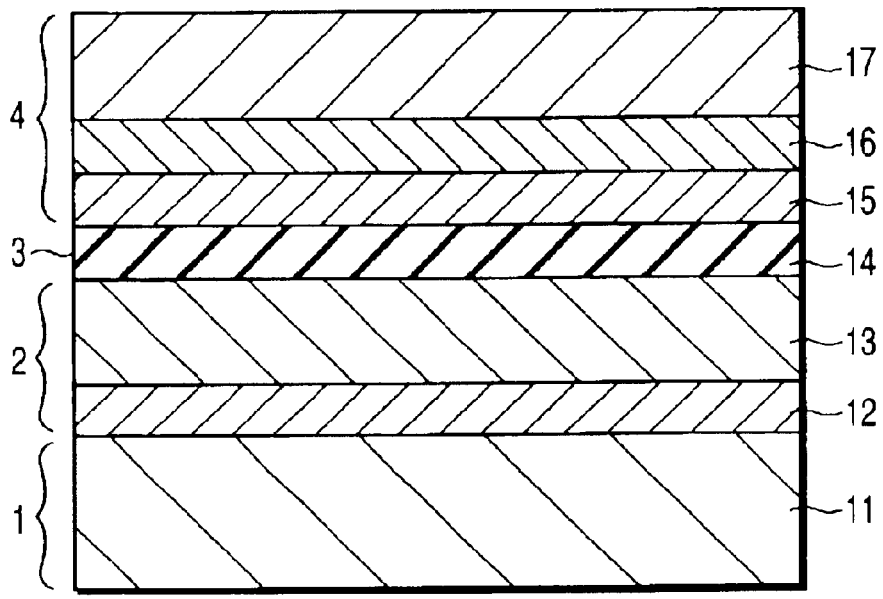
FIG. 1 is a cross-sectional view schematically showing the structure of a spin valve transistor according to a first embodiment of the present invention.

FIG. 1 is a cross-sectional view schematically showing the structure of a spin valve transistor according to the first embodiment of this invention.

The spin valve transistor shown in FIG. 1 comprises a collector region 1, a base region 2, a barrier layer 3, and an emitter region 4.

The collector region 1 is composed of a semiconductor layer 11 made of n-type Si, n-type GaAs or the like. In the present embodiment, the semiconductor layer 11 is made of n-type GaAs of (100) orientation.

The base region 2 is composed of a ferromagnetic layer 12 and a nonmagnetic layer 13. The ferromagnetic layer 12 is not fixed in magnetization direction. Its magnetization direction changes in accordance with the direction of the magnetic field emanating from a magnetic disc or the like. (More precisely, its magnetization direction becomes the same as the direction of the external magnetic field when the latter changes.) The ferromagnetic layer 12 has been formed on the semiconductor layer 11 by means of epitaxial growth. The interface between the semiconductor layer 11 and the ferromagnetic layer 12 is flat. The junction between the semiconductor layer 11 and the ferromagnetic layer 12 is a Schottky barrier. In this embodiment, the ferromagnetic layer 12 is made of Fe of (100) orientation, and the nonmagnetic layer 13 is made of Al of (100) orientation.

The barrier layer 3 is composed of a tunnel insulating layer 14. The barrier layer 3 may be a semiconductor layer for a Schottky barrier, instead of the insulating layer 14. In the present embodiment, the insulating layer 14 is made of $Al_2O_3$.

The emitter region 4 is composed of a ferromagnetic layer 15, an antiferromagnetic layer 16, and an electrode layer 17. The ferromagnetic layer 15 has its magnetization direction fixed by the antiferromagnetic layer 16, which is formed directly on the entire ferromagnetic layer 15. (That is, the magnetization direction is fixed by exchange bias.) In this embodiment, the ferromagnetic layer 15, antiferromagnetic layer 16 and electrode layer 17 are made of Fe, IrMn and Cu, respectively.

As an ordinary spin valve transistor, the current flowing from the emitter region 4 to the collector region 1 is relatively large as long as the magnetization direction of the ferromagnetic layer 12 is the same (or parallel) as that of the ferromagnetic layer 15. When the magnetization direction of the ferromagnetic layer 12 is opposite (or antiparallel) to that of the ferromagnetic layer 15, the current flowing from the emitter region 4 to the collector region 1 is relatively small. Hence, the magnetization direction of a magnetic disc or the like can be determined by detecting the magnitude of the current that flows to the collector region 1.

A spin valve transistor of the type shown in FIG. 1 was made on an n⁺ GaAs wafer by the following method, using an MBE (Molecular Beam Epitaxy) apparatus (about $2 \times 10^{-8}$ Pa) of multi-chamber type.

First, an n⁺ GaAs layer for the collector region was formed to a thickness of about 100 nm on the wafer, in the first chamber. The resultant structure was observed under an STM (Scanning Tunneling Microscope) and subjected to RHEED (Reflection High Electron-Energy Diffraction) observation. It was confirmed that the structure was a 2×4 one, with the surface of the GaAs layer terminated by As dimer. The terrace had a width of about 0.5 $\mu$m.

The wafer was transferred into the second chamber. A $CaF_2$ layer was formed to a thickness of about 200 nm, as an interlayer insulating film (not shown). The Schottky junction between the base and the collector had an area of approximately 50×50 $\mu$m. Then, an Fe thin film (about 1 nm thick) and a thin Al film (about 5 nm thick), which would be the base region, were sequentially formed by epitaxial growth. These thin films were formed at the rate of about 0.3 nm/min., by using a Knudsen cell.

Next, an $Al_2O_3$ tunnel insulating film was formed in the third chamber. The $O_2$ partial pressure was about $10^{-3}$ Pa and an Al source was employed, whereby the $Al_2O_3$ film acquired a thickness of about 1.5 nm.

Thereafter, the wafer was transferred back into the second chamber, in which a $CaF_2$ interlayer insulating film (not shown), about 200 nm thick, was formed. The tunnel junction between the base and the emitter had an area of approximately 50×50 $\mu$m. Further, an emitter, or an Fe/IrMn/Cu layer, was formed (the Fe film being about 2 nm thick, the IrMn film about 10 nm thick, and the Cu film about 100 nm thick).

A magnetic field was applied to the spin valve transistor thus made, thereby measuring the MR ratio and the collector/emitter current ratio (i.e., current gain). The MR ratio (%) and current gain with respect to the base-emitter voltage (V) were as follows:

| | | |
|---|---|---|
| 1.0 V | 240% | $4 \times 10^{-4}$ |
| 1.5 V | 210% | $1 \times 10^{-3}$ |
| 2.0 V | 180% | $6 \times 10^{-3}$ |
| 2.5 V | 160% | $1 \times 10^{-2}$ |
| 3.0 V | 150% | $3 \times 10^{-2}$ |
| 3.5 V | 130% | $7 \times 10^{-2}$ |
| 4.0 V | 100% | $2 \times 10^{-1}$ |

The MR ratio was about 160% and the current gain was about $1 \times 10^{-2}$ while a voltage of 2.5V was being applied.

As a first comparative example, a spin valve transistor comprising an n-Si (100) collector, an Au/Fe/Au/Fe/Al (111) base, an $Al_2O_3$ tunnel barrier, and an Al emitter was manufactured in the same way as the first embodiment described above.

No base film of (100) orientation was formed on the Si substrate; the base film formed had (111) orientation. A magnetic field was applied to the transistor, thereby measuring the MR and collector/emitter current ratio (i.e., current gain). The MR ratio was about 230% while a voltage of 2.5V was being applied between the base and the emitter. However, the current gain was very small, namely about $4 \times 10^{-4}$.

As a second comparative example, a device identical in structure to the first embodiment, except that the emitter region had no IrMn layer and was composed of an Fe film (about 2 nm thick) and a Cu film (about 100 nm thick), was manufactured. The device was tested for its MR ratio and its collector/emitter current ratio (i.e., current gain). The current gain was about $2 \times 10^{-2}$ while a voltage of 2.5V was applied, but the MR ratio was small, or about 20%.

In the present embodiment, the base region has the first ferromagnetic layer that changes in magnetization direction and the emitter region has the second ferromagnetic layer that is fixed in magnetization direction, as indicated above. Therefore, the number of interfaces of ferromagnetic layers is reduced in the base region. Hence, the diffuse scattering at the interface of the ferromagnetic layer can be suppressed to increase the ratio of the collector current to the emitter current (i.e., current gain).

Since the second ferromagnetic layer is provided in the emitter region, an antiferromagnetic layer can be easily formed on the entire second ferromagnetic layer to fix the magnetization direction thereof. Thus, the magnetization direction of the second ferromagnetic layer can be firmly fixed to provide a spin valve transistor that has a stable operating characteristic.

Moreover, the first ferromagnetic layer can have a lat interface since the first ferromagnetic layer is an epitaxial layer grown on the collector region. The diffuse scattering is more suppressed than otherwise. This can enhance the current gain more.

It is desired that the base region be thick to some extent in order to reduce the lead resistance. If the base region is composed of the first ferromagnetic layer only, however, the diffuse scattering will be more prominent, possibly decreasing the current gain. Since the nonmagnetic layer is provided between the first ferromagnetic layer and the barrier layer and/or between the first ferromagnetic layer and the collector region, the base region can have a desirable thickness and the diffuse scattering can be prevented from increasing. As a result, it is possible to increase the current gain.

Thus, this embodiment is a spin valve transistor that achieves a large current gain and excels in operating characteristic.

The MR ratio may decrease when the diffuse scattering is suppressed. Nevertheless, the MR ratio can be sufficiently large, because interface reflection that greatly depends on spin occurs at the interface between the ferromagnetic layer and the nonmagnetic layer, both made by epitaxial growth. It is known that the reflection of electrons moving in [100] direction greatly depends on the spin at the interface in, for example, an Fe(100)/Au(100),Fe(100)/Cr(100) structure, which can be epitaxially grown on a compound semiconductor.

Spin flip may take place when spin-polarized electrons are tunnel-injected from the emitter region into the base region, inevitably lowering the MR ratio. Nonetheless, the spin valve transistor can acquire a practically adequate MR ratio of 100% or more, if it has a good tunnel insulating film.

(Second Embodiment)

Figure 2:
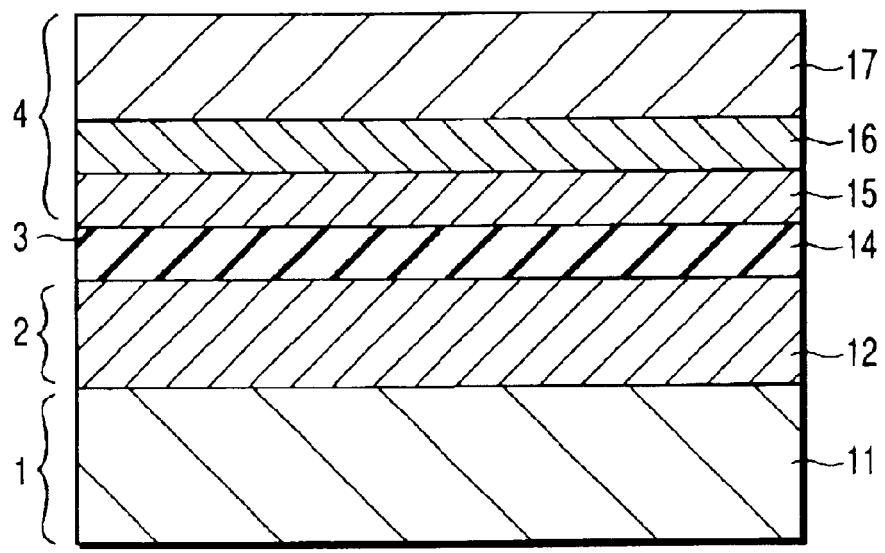
FIG. 2 is a cross-sectional view schematically showing the structure of a spin valve transistor according to a second embodiment of the present invention.

FIG. 2 is a cross-sectional view depicting the structure of a spin valve transistor according to the second embodiment of this invention.

The second embodiment is identical in basic structure to the first embodiment. The components that correspond to those of the first embodiment will be designated at the same reference numerals and will not be described in detail.

In this embodiment, the base region 2 is composed of only a ferromagnetic layer 12 whose magnetization direction changes in accordance with the direction of an external magnetic field, as illustrated in FIG. 2. That is, the base region 2 does not include such a nonmagnetic layer as is shown in FIG. 1. The ferromagnetic layer 12 has its magnetization direction changed in accordance with that of an external magnetic field.

A spin valve transistor of the structure shown in FIG. 2 was formed on an n+ GaAs wafer in the same way as the first embodiment. The layers of this transistor were an n+ GaAs layer 11 (about 100 nm thick), an Fe layer 12 (about 3 nm thick), an $Al_2O_3$ layer 14 (about 2 nm thick), an Fe layer 15 (about 1 nm thick), an IrMn layer 16 (about 10 nm thick), and a Cu layer 17 (about 100 nm thick).

A magnetic field was applied to the spin valve transistor thus made, thereby measuring the MR ratio and the collector/emitter current ratio (i.e., current gain). The MR ratio (%) and current gain with respect to the base-emitter voltage (V) were as follows:

| 1.0 V | 200% | $1 \times 10^{-4}$ |
| 1.5 V | 180% | $5 \times 10^{-4}$ |
| 2.0 V | 160% | $1 \times 10^{-3}$ |
| 2.5 V | 140% | $4 \times 10^{-3}$ |
| 3.0 V | 120% | $8 \times 10^{-3}$ |
| 3.5 V | 100% | $1 \times 10^{-3}$ |

To reduce the lead resistance in the base region, the Fe film 12 was made thick, about 3 nm. Inevitably, the diffuse scattering in the Fe layer increased and the current gain was smaller than that of the first embodiment. Despite this, the current gain was greater than that of a conventional spin valve transistor (the first comparative example). This is because the base region includes only one magnetic layer.

(Third Embodiment)

Figure 3:
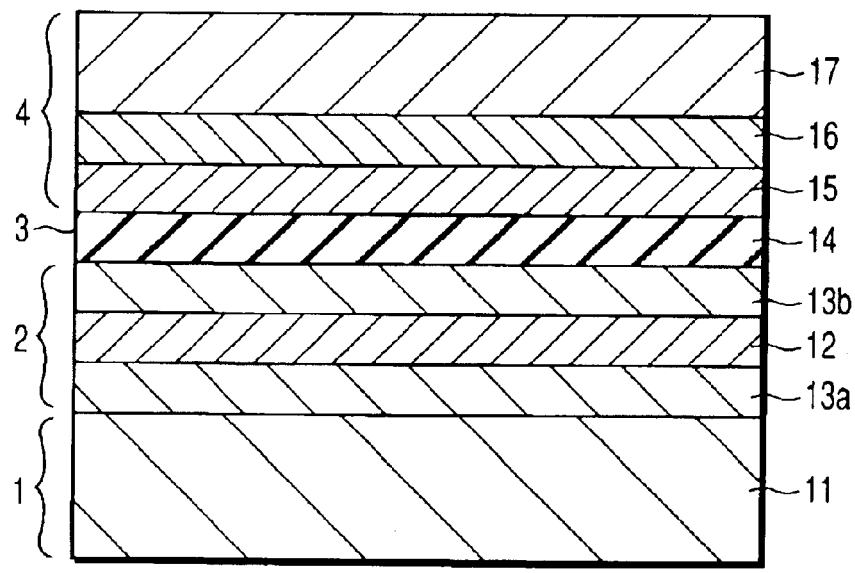
FIG. 3 is a cross-sectional view schematically showing the structure of a spin valve transistor according to a third embodiment of the present invention.
Figure 4:
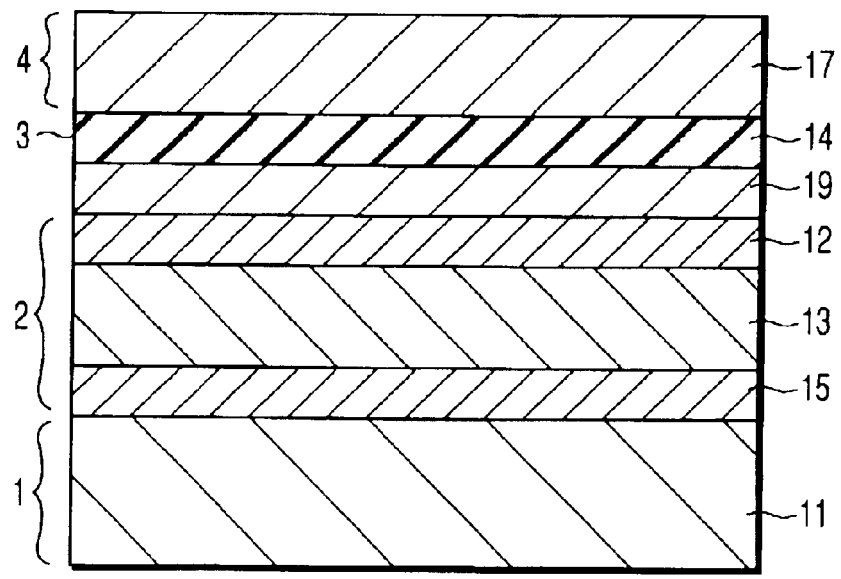
FIG. 4 is a cross-sectional view schematically showing the structure of a conventional spin valve transistor.

FIG. 3 is a cross-sectional view showing the structure of a spin valve transistor according to a third embodiment of the present invention.

The third embodiment is identical in basic structure to the first embodiment. The components that correspond to those of the first embodiment will be designated at the same reference numerals and will not be described in detail.

In the present embodiment, the base region 2 is composed of a nonmagnetic layer 13a, a ferromagnetic layer 12 and a nonmagnetic layer 13b, as is illustrated in FIG. 3. The nonmagnetic layers 13a and 13b sandwich the ferromagnetic layer 12 whose magnetization direction changes in accordance with the direction of an external magnetic field. In this embodiment, the collector region 1, or semiconductor layer 11, is made of silicon.

A spin valve transistor of the structure shown in FIG. 3 was formed on an n+ silicon wafer in the same method as the first embodiment. The layers of this transistor were an n+ Si layer 11 (n+ Si wafer, about 350 nm thick), an Au layer 13a (about 1 nm thick), an Fe layer 12 (about 1 nm thick), an Al layer 13b (about 2 nm thick), an $Al_2O_3$ layer 14 (about 2 nm thick), an Fe layer 15 (about 1 nm thick), an IrMn layer 16 (about 10 nm thick), and a Cu layer 17 (about 100 nm thick).

The device formed on the Si substrate had an improved current gain because the base region includes only one ferromagnetic layer and an antiferromagnetic layer lay on the ferromagnetic layer of the emitter region. When a voltage of 2.5V was applied between the base and the emitter, the collector/emitter current ratio (i.e., current gain) was about $8 \times 10^{-3}$, though the MR ratio was about 180%.

In each of the embodiments described above, it is desired that the hot electrons injected from the emitter region into the base region should have energy of about 2 eV or more. In any spin valve transistor, an decrease in the ratio of the emitter current to the collector current may be attributed not only to the diffuse scattering described above, but also to the reflection of hot electrons at the interface between the base and the collector. The reflection can be classified into the reflection by the interface barrier, which depends on the conditions of forming the interface, and the quantum mechanical reflection which results from the difference in wavelength between the electrons in a semiconductor and the electrons in a metal. The larger the energy of the electrons (hot electrons), the lower the reflectivity of electrons, no matter whichever type the reflection is. More specifically, the reflectivity of hot electrons that have energy (about 2 eV or more) much greater than the Schottky barrier height decreases very much.

It is therefore desired that the hot electrons injected into the base region should have energy of about 2 eV or more.

If the energy exceeds about 5 eV, however, the hot electrons will undergo acute inelastic scattering in the base region, due to plasmon excitation. In view of this, the energy of the hot electrons should be about 5 eV or less. This range of the hot electron energy can be applied not only to the spin valve transistor according to each embodiment described above, but also to the known spin valve transistors.

In each embodiment described above, the ferromagnetic layers provided in the base region and emitter region can be made of Fe, Co or Ni, or an alloy of at least two of these metal elements. Further, the nonmagnetic layer provided in the base region can be made of Au, Ag, Pt, Cu, Al, Cr or Mn, or an alloy of at least of these metal elements. Preferably, the ferromagnetic layers and the nonmagnetic layers should be oriented in [100] direction or [110] direction. Moreover, the semiconductor provided in the collector region can be a III–V compound semiconductor, a II–IV compound semiconductor or a VI semiconductor. A III–V compound semiconductor is most preferred. More particularly, the semiconductor can be GaAs, GaN, GaP, InAs or InSb.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A spin valve transistor comprising:
    a collector region made of semiconductor;
    a base region provided on the collector region and including a first ferromagnetic layer whose magnetization direction changes in accordance with a direction of an external magnetic field;
    a barrier layer provided on the base region and made of insulator or semiconductor; and
    an emitter region provided on the barrier layer and including a second ferromagnetic layer whose magnetization direction is fixed,
    wherein the base region further includes a nonmagnetic layer provided between the first ferromagnetic layer and the barrier layer.

2. The spin valve transistor according to claim 1, wherein the nonmagnetic layer is made of Au, Ag, Pt, Cu, Al, Cr or Mn, or an alloy of at least two elements selected from Au, Ag, Pt, Cu, Al, Cr and Mn.

3. A spin valve transistor comprising:
    a collector region made of semiconductor;
    a base region provided on the collector region and including a first ferromagnetic layer whose magnetization direction changes in accordance with a direction of an external magnetic field;
    a barrier layer provided on the base region and made of insulator or semiconductor; and
    an emitter region provided on the barrier layer and including a second ferromagnetic layer whose magnetization direction is fixed,
    wherein the base region further includes a nonmagnetic layer provided between the first ferromagnetic layer and the collector region.

4. The spin valve transistor according to claim 3, wherein the nonmagnetic layer is made of Au, Ag, Pt, Cu, Al, Cr or Mn, or an alloy of at least two elements selected from Au, Ag, Pt, Cu, Al, Cr and Mn.

5. The spin valve transistor according to claim 1, wherein the emitter region further includes an antiferromagnetic layer provided on the second ferromagnetic layer.

6. The spin valve transistor according to claim 5, wherein the antiferromagnetic layer fixes the magnetization direction of the second ferromagnetic layer.

7. The spin valve transistor according to claim 5, wherein the emitter region further includes an electrode layer provided on the antiferromagnetic layer.

8. The spin valve transistor according to claim 1, wherein the second ferromagnetic layer is made of Fe, Co or Ni, or an alloy of at least two elements selected from Fe, Co and Ni.

9. The spin valve transistor according to claim 1, wherein the first ferromagnetic layer is an epitaxial layer grown on the collector region.

10. The spin valve transistor according to claim 1, wherein the first ferromagnetic layer is made of Fe, Co or Ni, or an alloy of at least two elements selected from Fe, Co and Ni.

11. The spin valve transistor according to claim 1, wherein the collector region is made of a III–V compound semiconductor, a II–VI compound semiconductor or a group IV semiconductor.

12. The spin valve transistor according to claim 3, wherein the emitter region further includes an antiferromagnetic layer provided on the second ferromagnetic layer.

13. The spin valve transistor according to claim 12, wherein the antiferromagnetic layer fixes the magnetization direction of the second ferromagnetic layer.

14. The spin valve transistor according to claim 12, wherein the emitter region further includes an electrode layer provided on the antiferromagnetic layer.

15. The spin valve transistor according to claim 3, wherein the second ferromagnetic layer is made of Fe, Co or Ni, or an alloy of at least two elements selected from Fe, Co and Ni.

16. The spin valve transistor according to claim 3, wherein the first ferromagnetic layer is an epitaxial layer grown on the collector region.

17. The spin valve transistor according to claim 3, wherein the first ferromagnetic layer is made of Fe, Co or Ni, or an alloy of at least two elements selected from Fe, Co and Ni.

18. The spin valve transistor according to claim 3, wherein the collector region is made of a III–V compound semiconductor, a II–VI compound semiconductor or a group IV semiconductor.

* * * * *